(12) United States Patent
Lee

(10) Patent No.: US 6,903,988 B2
(45) Date of Patent: Jun. 7, 2005

(54) SEMICONDUCTOR MEMORY DEVICE

(75) Inventor: Ihl Ho Lee, Seoul (KR)

(73) Assignee: Hynix Semiconductor Inc., Kyungki-Do (KR)

( * ) Notice: Subject to any disclaimer, the term of this patent is extended or adjusted under 35 U.S.C. 154(b) by 0 days.

(21) Appl. No.: 10/736,860

(22) Filed: Dec. 16, 2003

(65) Prior Publication Data

US 2004/0240290 A1 Dec. 2, 2004

(30) Foreign Application Priority Data

May 26, 2003 (KR) ................................ 10-2003-0033421

(51) Int. Cl.$^7$ ................................................ G11C 7/00
(52) U.S. Cl. ..................... 365/205; 365/203; 365/202
(58) Field of Search ................................ 365/205, 203, 365/202

(56) References Cited

U.S. PATENT DOCUMENTS 5,905,685 A  *  5/1999   Nakamura et al. .......... 365/205
6,545,897 B2 *  4/2003   Fujisawa et al. .............. 365/63

* cited by examiner

*Primary Examiner*—Huan Hoang
(74) *Attorney, Agent, or Firm*—Marshall, Gerstein & Borun LLP

(57) ABSTRACT

The present invention relates to a semiconductor memory device. A voltage generator for supplying a sense amplifier I/O voltage (VSIO) and a voltage generator for supplying a bit line precharge voltage (VBLP) are independently separated. It is possible to prevent the bit line precharge voltage (VBLP) from increasing when the sense amplifier I/O voltage (VSIO) is increased due to the introduction of a column reset voltage (VCORE).

6 Claims, 11 Drawing Sheets

SEMICONDUCTOR MEMORY DEVICE

BACKGROUND

1. Field of the Invention

The present invention relates to a semiconductor memory device, and, more specifically, to a semiconductor memory device capable of fundamentally preventing an increase of a bit line precharge voltage (VBLP) that is inevitably generated when there are a large amount of charges charged into local I/O lines LIO, LIOb by a column reset voltage (VCORE).

2. Discussion of Related Art

Generally, FIG. 1 illustrates a bank configuration schematically shown to explain the structure of a DRAM memory device to which a common shared sense amplifier mode is applied.

As shown in FIG. 1, the common DRAM memory device consists of a number of banks. Each bank includes a number of bit line sense amplifier arrays BLSA0 to BLSAn, and matrix cell arrays MAT0 to MATn that are alternately positioned with the bit line sense amplifier arrays BLSA0 to BLSAn. The matrix cell arrays MAT0 to MATn are selected by a word line WL activated by a X-decoder 10 according to an address signal.

As shown in FIGS. 2 and 3, data selected by a column signal (Yi) outputted from a Y-decoder (not shown) are inputted to an I/O sense amplifier IOSA through a local I/O line LIO and a local I/O line bar LIOb, and a sense amplifier I/O line SIO and a sense amplifier I/O line bar SIOb. In order to increase the transfer speed of data, lots of the column signals are operated at a time depending on its use. FIG. 2 is a circuit diagram in which four data each sensed through the four-bit line sense amplifier BLSA are simultaneously transmitted to the sense amplifier I/O lines SIO, SIOb by a single column signal by way of example. Further, the I/O sense amplifier IOSA can be made to operate at a time (IOSA<0:n>) depending on its use.

For example, as shown in FIG. 2, four local I/O lines LIO(b)0 to LIO(b)3 correspond to the four sense amplifier I/O lines SIO(b)0 to SIO(b)3 one to one. Every two line sense amplifiers BLSA are positioned at upper and lower sides on the basis of each of the matrix cell arrays MAT0 to MATn. The bit lines BL, BLb connected to the bit line sense amplifier BLSA are electrically one-to-one connected to the sense amplifier I/O lines SIO, SIOb through transistors Q1 and Q2 controlled by the column signal (Y1). Further, the sense amplifier I/O lines SIO, SIOb are electrically one-to-one connected to the local I/O lines LIO, LIOb through transistors Q6 and Q7 controlled by a row matrix signal (Row_mat).

In the concrete, as shown in FIG. 3, connection between the sense amplifier I/O lines SIO, SIOb and the bit lines BL, BLb is controlled by the column signal (Yi). Connection between the sense amplifier I/O lines SIO, SIOb and the local I/O lines LIO, LIOb is controlled by the row matrix signal (Row_mat). The row matrix signal (Row_mat) is a coding signal of the matrix cell arrays MAT0 to MATn in an active operation ACT, which controls electrical connection between the sense amplifier I/O lines SIO, SIOb and the local I/O lines LIO, LIOb. On the contrary, the row matrix bar signal (Row_matb) makes the sense amplifier I/O lines SIO, SIOb equalized to have the same voltage level, while precharging them with the bit line precharge voltage (VBLP) level. The column reset bar signal (Col_RSTb) makes the local I/O lines LIO, LIOb equalized to have the same voltage level before the column signal (Yi) is activated, while precharging them with the column reset voltage (VCORE) level. In general, the column-reset voltage (VCORE) has an ideal value that is twice of the bit line precharge voltage (VBLP). If the bit line precharge voltage (VBLP) is higher or lower than a reference value, a fail may take place in a read operation after a reference refresh in sensing High or Low data. In other words, it may have a bad influence on the refresh characteristic.

Generally, the bit line precharge voltage (VBLP) is generated from the bit line precharge voltage generator 20. As shown in FIG. 5, the bit line precharge voltage (VBLP) is commonly supplied to the bit line sense amplifier BLSA and the sense amplifier I/O lines SIO, SIOb within a neighboring bank (for example, BANK0 and BANK1 shown). Accordingly, a supply line 22 for supplying the bit line precharge voltage (VBLP) of the bit line precharge voltage generator 20 is connected to an equalization circuit 12 in a mesh form within each of the banks BANK0 and BANK1. Though not shown in the drawing, the supply line 22 is connected to an equalization circuit for equalizing the bit lines BL, BLb.

As shown in FIG. 4, before the row matrix signal (Row_mat) shifts from a Low level to a High level after the active operation ACT command is issued, the potential of the sense amplifier I/O lines SIO, SIOb are precharged with the bit line precharge voltage (VBLP) by means of transistors Q3 to Q5 operated by the row matrix bar signal (Row_matb). Also the potential of the local I/O line LIO maintains the column-reset voltage (VCORE) since the column reset bar signal (Col_RSTb) is kept High in level and the transistors Q8 to Q10 of the equalization circuit 14 are driven accordingly.

Thereafter, if the row matrix signal (Row_mat) shifts from the Low level to the High level and the row matrix bar signal (Row_matb) shifts from the High level to the Low level, the sense amplifier I/O lines SIO, SIOb are slowly charged with the column reset voltage (VCORE) by means of the potential of the local I/O lines LIO, LIOb that maintains the column reset voltage (VCORE). In other words, the local I/O line LIO charged with the column reset voltage (VCORE) and the sense amplifier I/O lines SIO, SIOb charged with the bit line precharge voltage (VBLP) are electrically connected through the transistors Q6 and Q7 operated by the row matrix signal (Row_mat). Accordingly, the column-reset voltage (VCORE) that is a relatively high voltage is introduced into the bit line precharge voltage (VBLP) through the transistors Q6 and Q7. Thereby the bit line precharge voltage (VBLP) charged into the sense amplifier I/O lines SIO, SIOb becomes 'VBLP>VCP' by means of the column reset voltage (VCORE), as shown in FIG. 6. In the above, 'VCP' is a cell plate voltage, which is a half of the column reset voltage (VCORE).

Next, in a stand-by PCG operating command, the row matrix signal (Row_mat) becomes a Low level and the row matrix bar signal (Row_matb) becomes a High level. For this reason, the potentials of the sense amplifier I/O lines SIO, SIOb that are charged with the column reset voltage (VCORE) are both discharged with the bit line precharge voltage (VBLP). In other words, the local I/O line LIO and the sense amplifier I/O lines SIO, SIOb are electrically isolated by the row matrix signal (Row_mat) and the column reset voltage (VCORE) is no longer introduced into the sense amplifier I/O lines SIO, SIOb accordingly. Thereby the sense amplifier I/O lines SIO, SIOb are discharged with the bit line precharge voltage (VBLP).

In the above, how far is the amount of the column reset voltage (VCORE) introduced into the sense amplifier I/O lines SIO, SIOb from the local I/O lines LIO, LIOb problematic to the device operation, depends on whether the word line WL will be activated several times at a time. This phenomenon may frequently take place depending on the capacity of the memory or the amount of the bank works that are consecutively performed. In other words, upon the active operation ACT, the column-reset voltage (VCORE) is backward introduced into the output terminal of the bit line precharge voltage generator 20 through the sense amplifier I/O lines SIO, SIOb. Accordingly, the bit line precharge voltage (VBLP) outputted to the bit line precharge voltage generator 20 becomes increased. As a result, as shown in FIG. 4, the bit line precharge voltage (VBLP) that is applied in order to make the bit lines BL, BLb equalized is also increased due to the increase of the bit line precharge voltage (VBLP). Therefore, it hinders the sensing operation of the bit line sense amplifier BLSA. In other words, when the refresh operation is performed or the operation of the several banks is performed, degradation of a cell data caused by the increased bit line precharge voltage (VBLP) affects a value read after a refresh interval.

As described above, in order to preclude the introduction of the column reset voltage (VCORE), a method for discharging as much as an increased voltage level, i.e., an introduced column reset voltage (VCORE) using a sensor (not shown) is positioned at the output terminal of a bit line precharge voltage generator 20 (see FIG. 5) for generating the bit line precharge voltage (VBLP), may be considered. This method, however, may not be sufficient when the loading of the sense amplifier I/O lines SIO, SIOb is high. Therefore, there is a need for a new method for precluding the column reset voltage (VCORE) from being introduced into the bit line precharge voltage (VBLP).

SUMMARY OF THE INVENTION

The present invention is directed to a semiconductor memory device capable of fundamentally preventing an increase of a bit line precharge voltage (VBLP) that is inevitably generated, where an active operation is repeatedly performed as bit lines BL, BLb commonly connected to local I/O lines LIO, LIOb and bit line sense amplifier BLSA are precharged with a bit line precharge voltage (VBLP) or when there are a large amount of charges charged into the local I/O lines LIO, LIOb by a column reset voltage (VCORE).

According to a preferred embodiment of the present invention, there is provided a semiconductor memory device including a cell array consisting of a number of memory cells; a bit line sense amplifier connected to the memory cell through a bit line, for sensing data of the memory cell; a bit line equalization circuit for equalizing the bit line sense amplifier with the same voltage level; a sense amplifier I/O line electrically connected to the bit line according to a column signal; a sense amplifier I/O line equalization circuit for equalizing the sense amplifier I/O line with the same voltage level; a local I/O line electrically connected to the sense amplifier I/O line according to a row matrix signal; a local I/O line equalization circuit for equalizing the local I/O line with the same voltage level; and a I/O sense amplifier connected to the local I/O line, for sensing and outputting the data sensed through the bit line sense amplifier, wherein the bit line and the sense amplifier I/O line are equally precharged with voltages that are independently supplied through different supply lines by the bit line equalization circuit and the sense amplifier I/O line equalization circuit that are operated by an inverse signal of the row matrix signal.

One aspect of the present invention is to provide a semiconductor memory device including a bit line, a bit line sense amplifier for sensing data of a memory cell through the bit line, a sense amplifier I/O line electrically connected to the bit line according to a column signal, a local I/O line electrically connected to the sense amplifier I/O line according to a row matrix signal, and an I/O sense amplifier for outputting the data sensed through the bit line sense amplifier through the local I/O line, both ends of the bit line and the sense amplifier I/O line are precharged with the same voltage level by means of voltages that are independently supplied through different supply lines.

In the aforementioned of a semiconductor memory device according to another embodiment of the present invention, the voltages are generated through different voltage generators, respectively.

In the aforementioned of a semiconductor memory device according to another embodiment of the present invention, the voltages are generated through the same voltage generator.

DETAILED DESCRIPTION OF PREFERRED EMBODIMENTS

Now the preferred embodiments according to the present invention will be described with reference to the accompanying drawings. Since preferred embodiments are provided for the purpose that the ordinary skilled in the art are able to understand the present invention, they may be modified in various manners and the scope of the present invention is not limited by the preferred embodiments described later.

Figure 7:
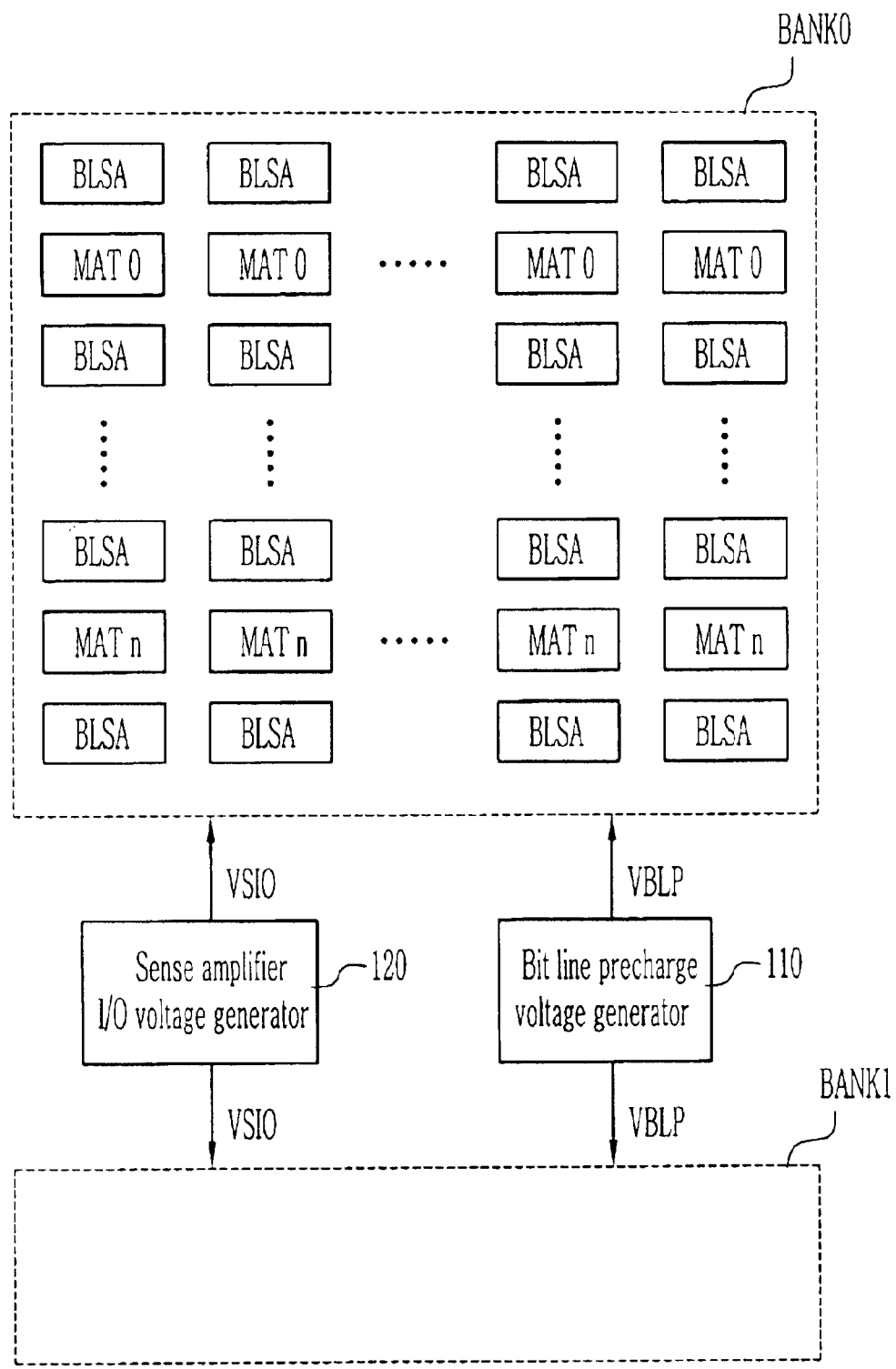
FIG. 7 is a block diagram illustrating the construction of a semiconductor memory device according to a preferred embodiment of the present invention.

FIG. 7 is a block diagram illustrating the construction of a semiconductor memory device according to a preferred embodiment of the present invention.

Referring to FIG. 7, the semiconductor memory device of the present invention include a number of banks BANK0, BANK1 having a number of bit line sense amplifiers BLSA and a number of matrix cell arrays MAT0 to MATn. The semiconductor memory device further includes a bit line precharge voltage generator 110 for generating a bit line precharge voltage (VBLP) and a sense amplifier I/O voltage generator 120 for generating a sense amplifier I/O voltage (VSIO). In the above, the sense amplifier I/O voltage (VSIO) and the bit line precharge voltage (VBLP) have the same voltage level, i.e., ½ of a column reset voltage (VCORE).

Figure 8A:
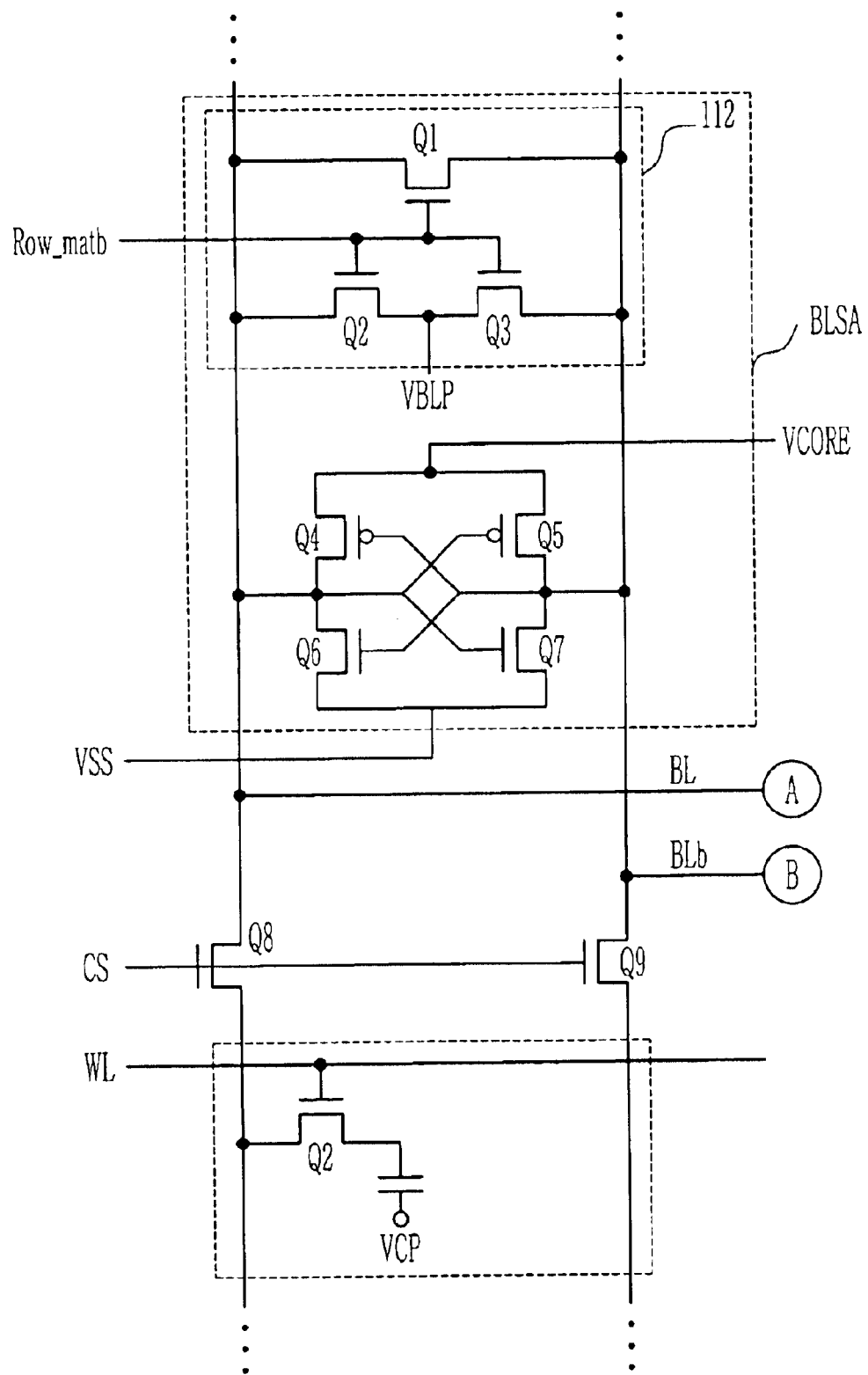
FIGS. 8A and 8B are circuit diagrams illustrating the I/O lines from the bit line sense amplifier BLSA to the I/O sense amplifier IOSA according to a preferred embodiment of the present invention.
Figure 8B:
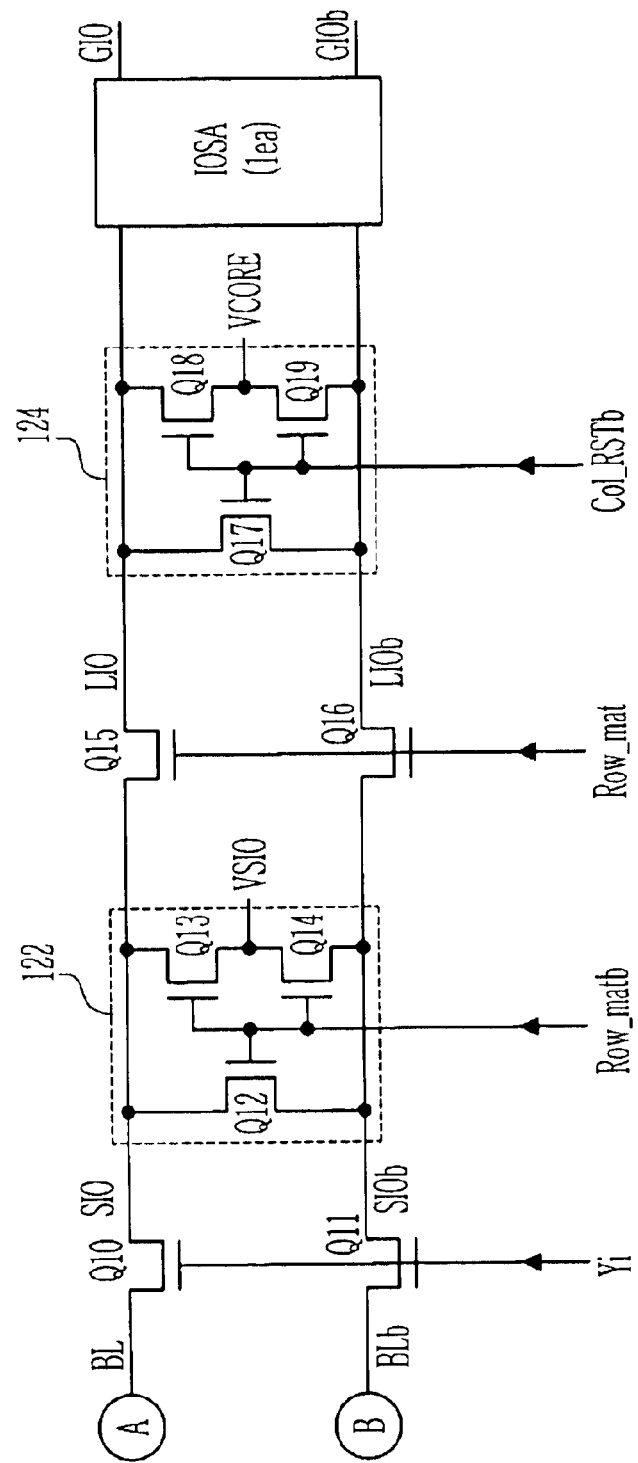

As shown in FIG. 8A, the bit line precharge voltage generator 110 supplies the bit line precharge voltage (VBLP) to a bit line equalization circuit 112. The bit line equalization circuit 112 includes transistors Q1 to Q3 operated by a row matrix bar signal (Row_matb) and precharges bit lines BL, BLb with the bit line precharge voltage (VBLP) according to the matrix bar signal (Row_matb). Meanwhile, as shown in FIG. 8B, the sense amplifier I/O voltage generator 120 supplies a sense amplifier I/O voltage (VSIO) to a sense amplifier I/O line equalization circuit 122. The sense amplifier I/O line equalization circuit 122 includes transistors Q12 to Q14 operated by the row matrix bar signal (Row_matb) and precharges sense amplifier I/O lines SIO, SIOb with the sense amplifier I/O voltage (VSIO) according to the matrix bar signal (Row_matb). Meanwhile, the column-reset voltage (VCORE) is supplied from a column reset voltage generator (not shown). Local I/O lines LIO, LIOb are prechared with the column reset voltage (VCORE) by means of a local I/O line equalization circuit 124 operated by a column reset bar signal (Col_RSTb). The column-reset voltage (VCORE) has a voltage level higher twice than that of the bit line precharge voltage (VBLP) or the sense amplifier I/O voltage (VSIO).

Figure 9:
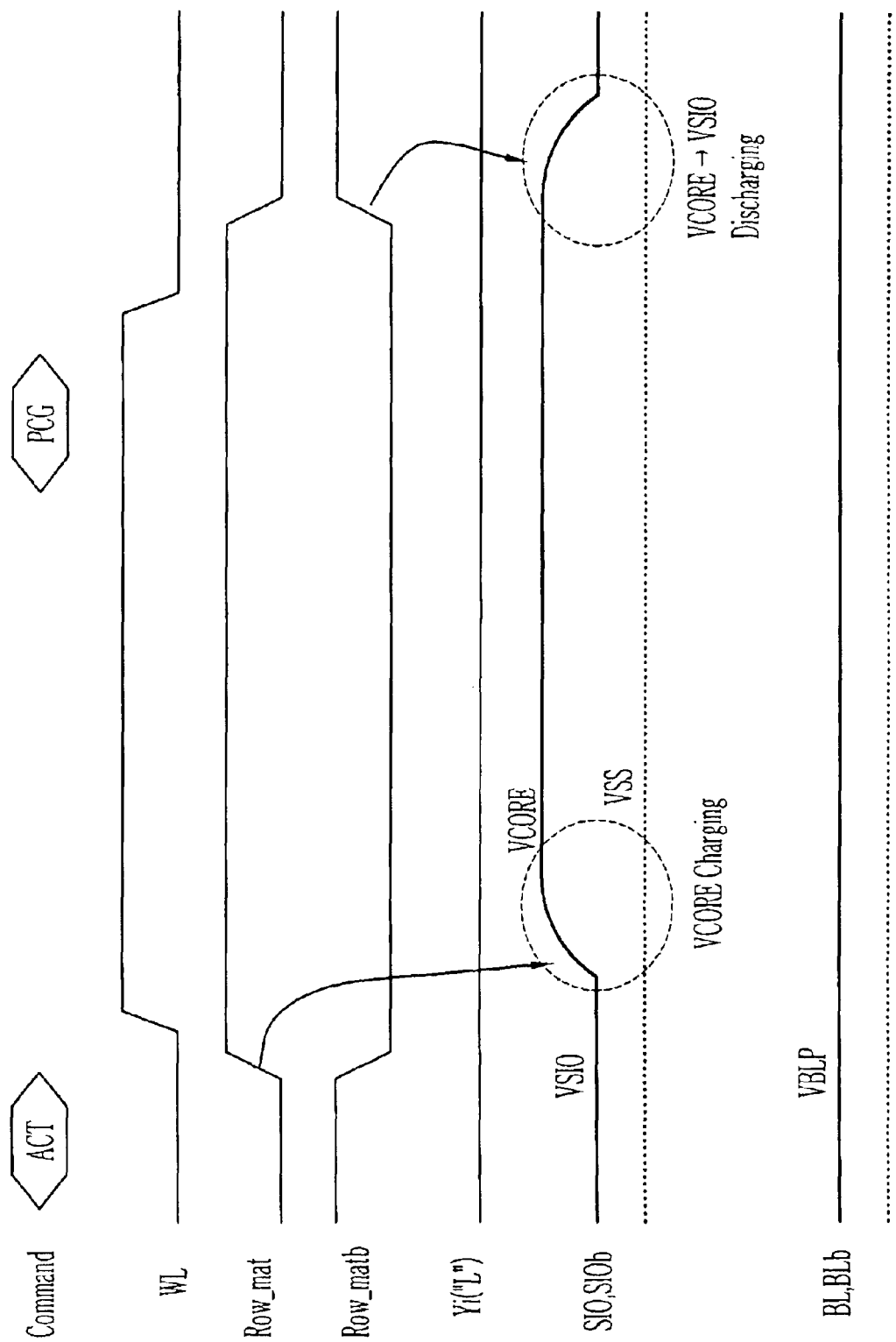
FIG. 9 shows a waveform shown to explain variation in the bit line precharge voltage (VBLP) depending on the introduction of the column reset voltage (VCORE) in the active operation of the bank according to a preferred embodiment of the present invention.

As shown in FIG. 9, before a row matrix signal (Row_mat) shifts from a Low level to a High level after an active operation ACT command is issued, the potential of the sense amplifier I/O lines SIO, SIOb are precharged with the sense amplifier I/O voltage (VSIO) by means of a sense amplifier I/O line equalization circuit 122 operated by the row matrix bar signal (Row_matb). Also the potential of the bit lines BL, BLb are precharged with the bit line precharge voltage (VBLP) by means of the bit line equalization circuit 112 operated by the row matrix bar signal (Row_matb). Further, the potential of the local I/O line LIO maintains the column reset voltage (VCORE) since the column reset bar signal (Col_RSTb) is kept High in level and the local I/O line equalization circuit 124 is thus operated.

Thereafter, in case that the row matrix signal (Row_mat) shifts from the Low level to the High level and the row matrix bar signal (Row_matb) shifts from the High level to the Low level, the sense amplifier I/O lines SIO, SIOb are slowly charged from the sense amplifier I/O voltage (VSIO) to the column reset voltage (VCORE) by means of the potential of the local I/O lines LIO, LIOb that maintain the column reset voltage (VCORE). In other words, the local I/O line LIO precharged with the column reset voltage (VCORE) and the sense amplifier I/O lines SIO, SIOb charged with the sense amplifier I/O voltage (VSIO) are electrically connected through transistors Q15 and Q16 operated by the row matrix signal (Row_mat) and the column reset voltage (VCORE) that is relatively a high potential is introduced into the sense amplifier I/O lines SIO, SIOb through the transistors Q15 and Q16. Thereby the potential of the sense amplifier I/O lines SIO, SIOb is slowly increased to the column-reset voltage (VCORE). At this time, the potential of the bit lines BL, BLb maintains the bit line precharge voltage (VBLP) regardless of an increase in the potential of the sense amplifier I/O lines SIO, SIOb.

Figure 1:
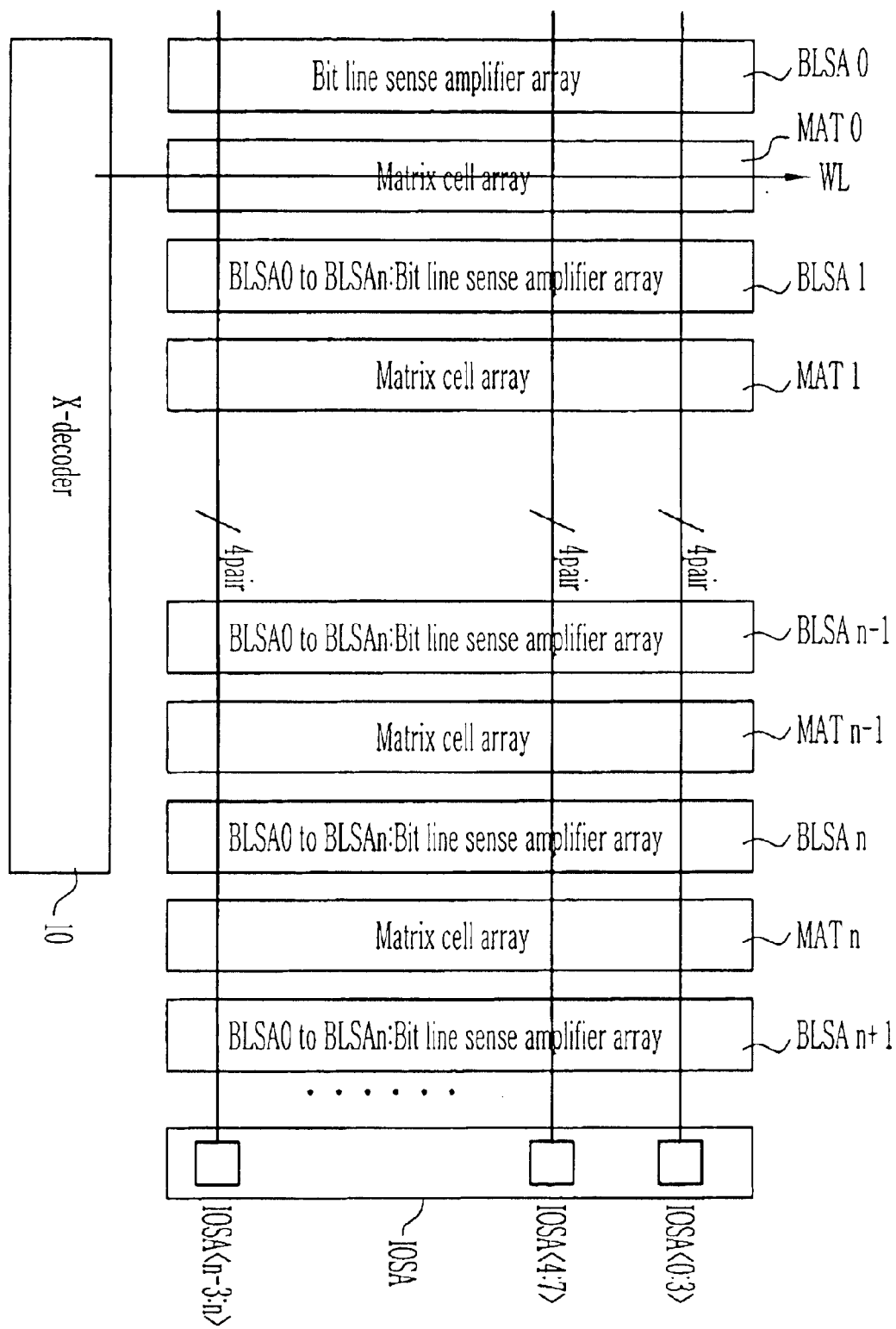
FIG. 1 illustrates a bank configuration schematically shown to explain the structure of a DRAM memory device to which a common shared sense amplifier mode is applied.
Figure 2:
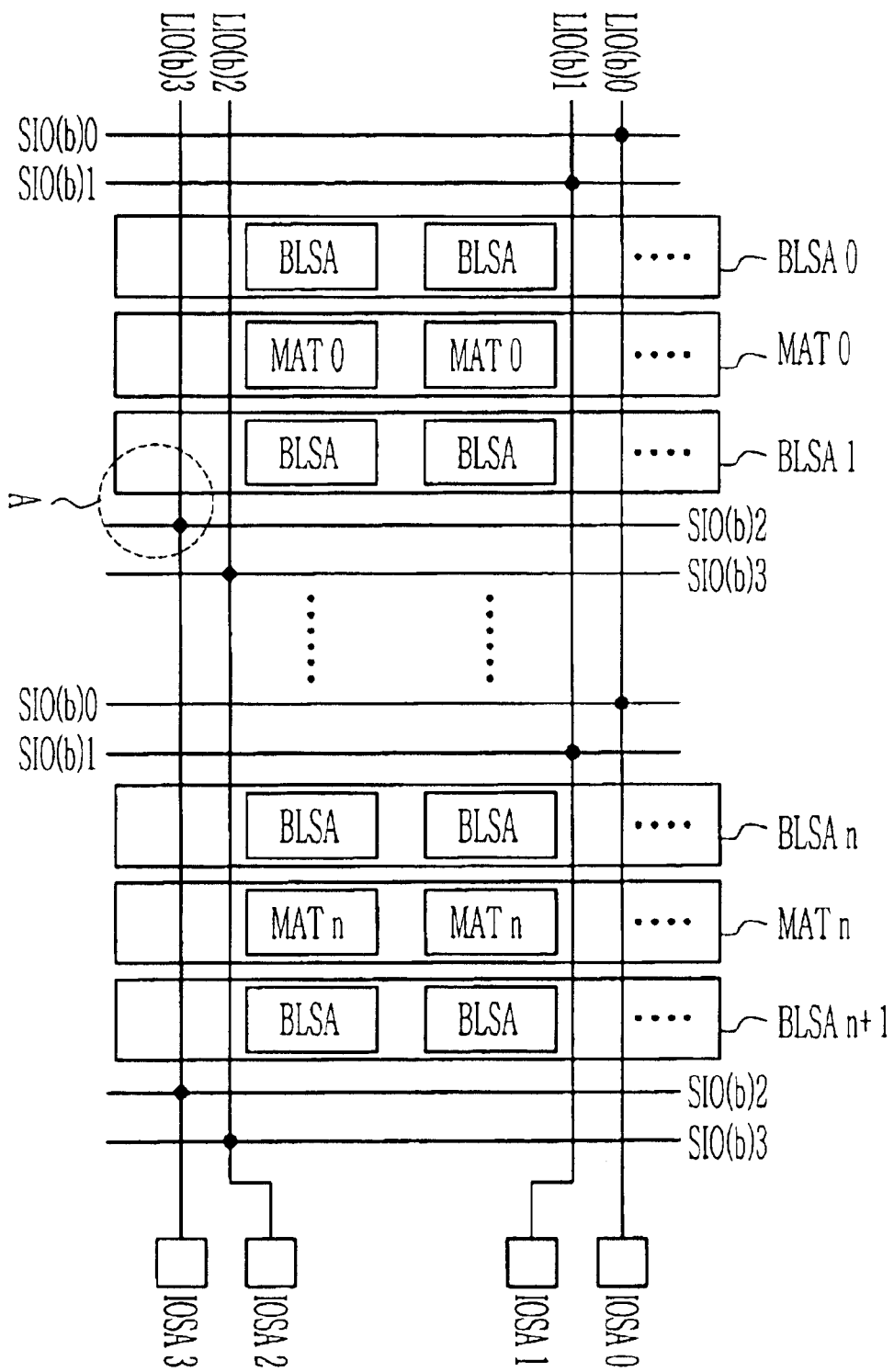
FIG. 2 is a circuit diagram, in which four data sensed through four-bit line sense amplifiers BLSA respectively, are simultaneously transmitted to sense amplifier I/O lines SIO, SIOb by a single column signal.
Figure 3:
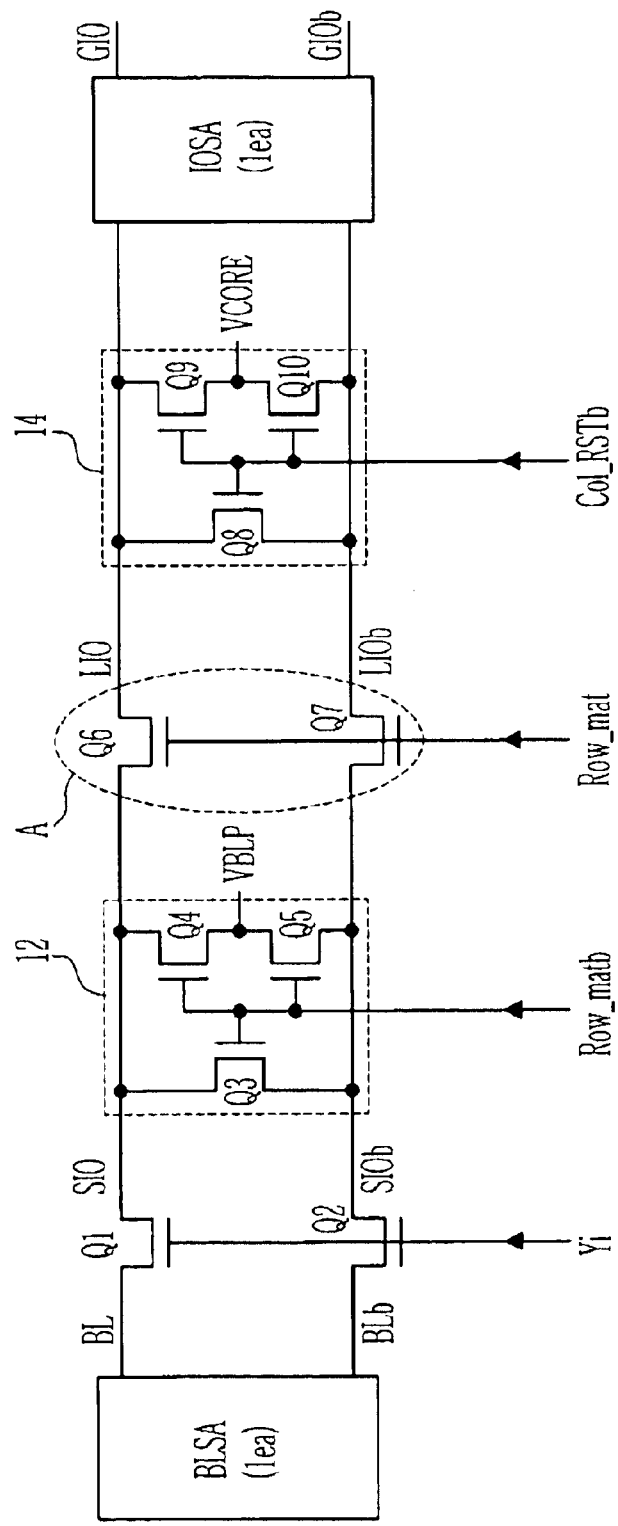
FIG. 3 is a circuit diagram illustrating I/O lines from the bit line sense amplifier BLSA to the I/O sense amplifier IOSA.
Figure 4:
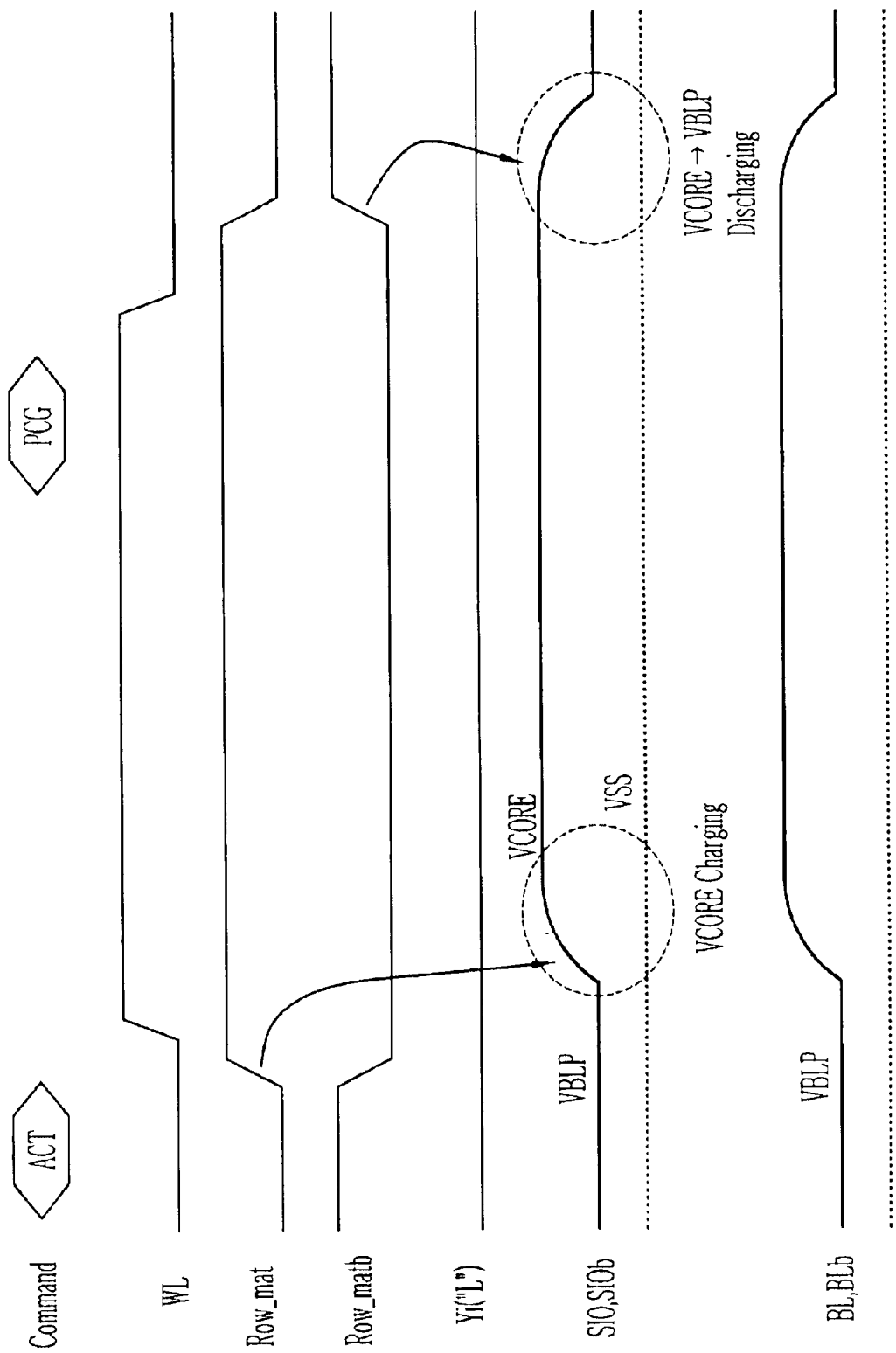
FIG. 4 shows a waveform shown to explain that a column reset voltage (VCORE) is introduced into a bit line precharge voltage (VBLP) in an active operation of the bank.
Figure 5:
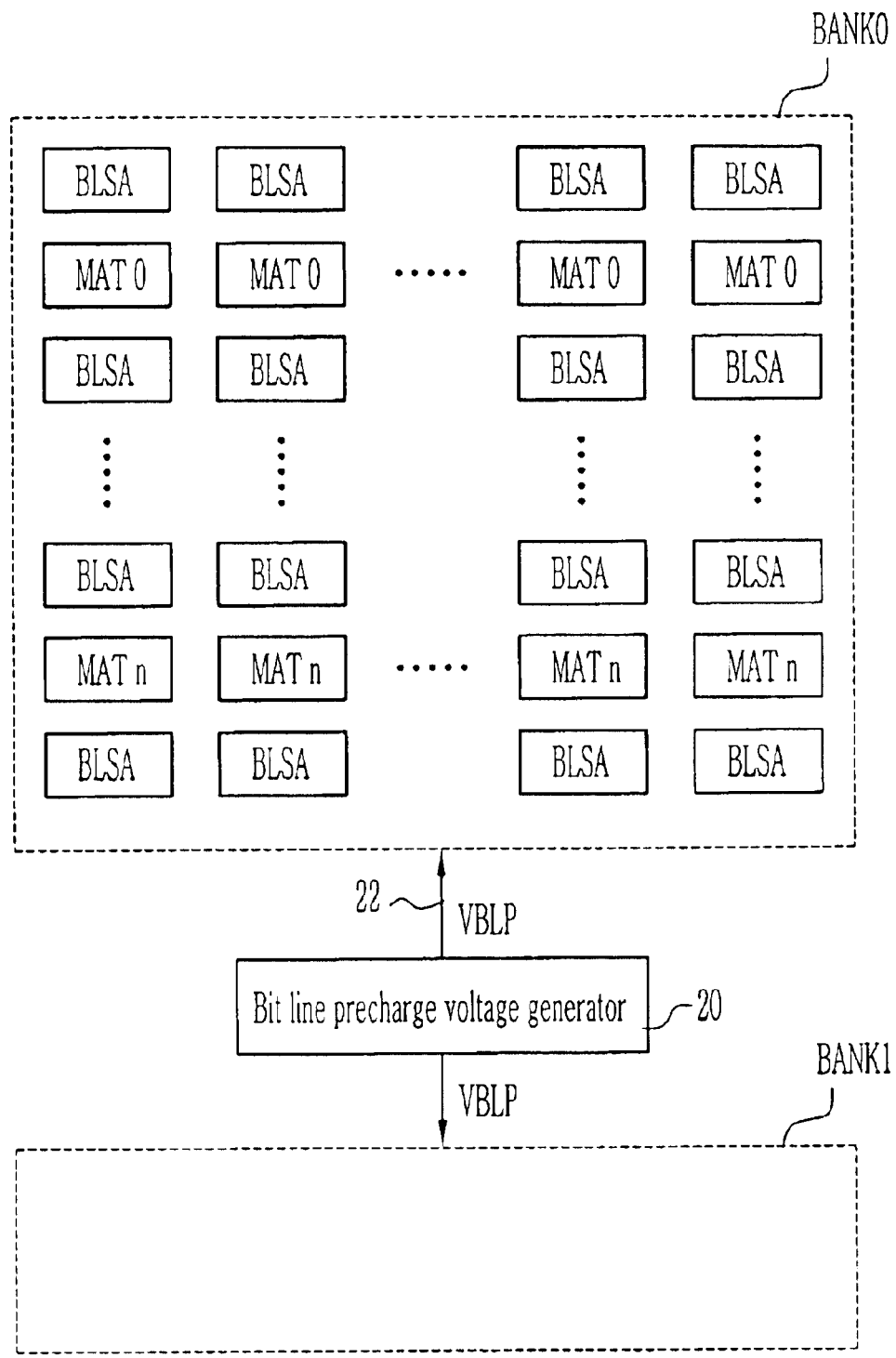
FIG. 5 is a block diagram shown to explain that the bit line precharge voltage (VBLP) generated through a single bit line precharge voltage generator is supplied to the bank according to a prior art.
Figure 6:
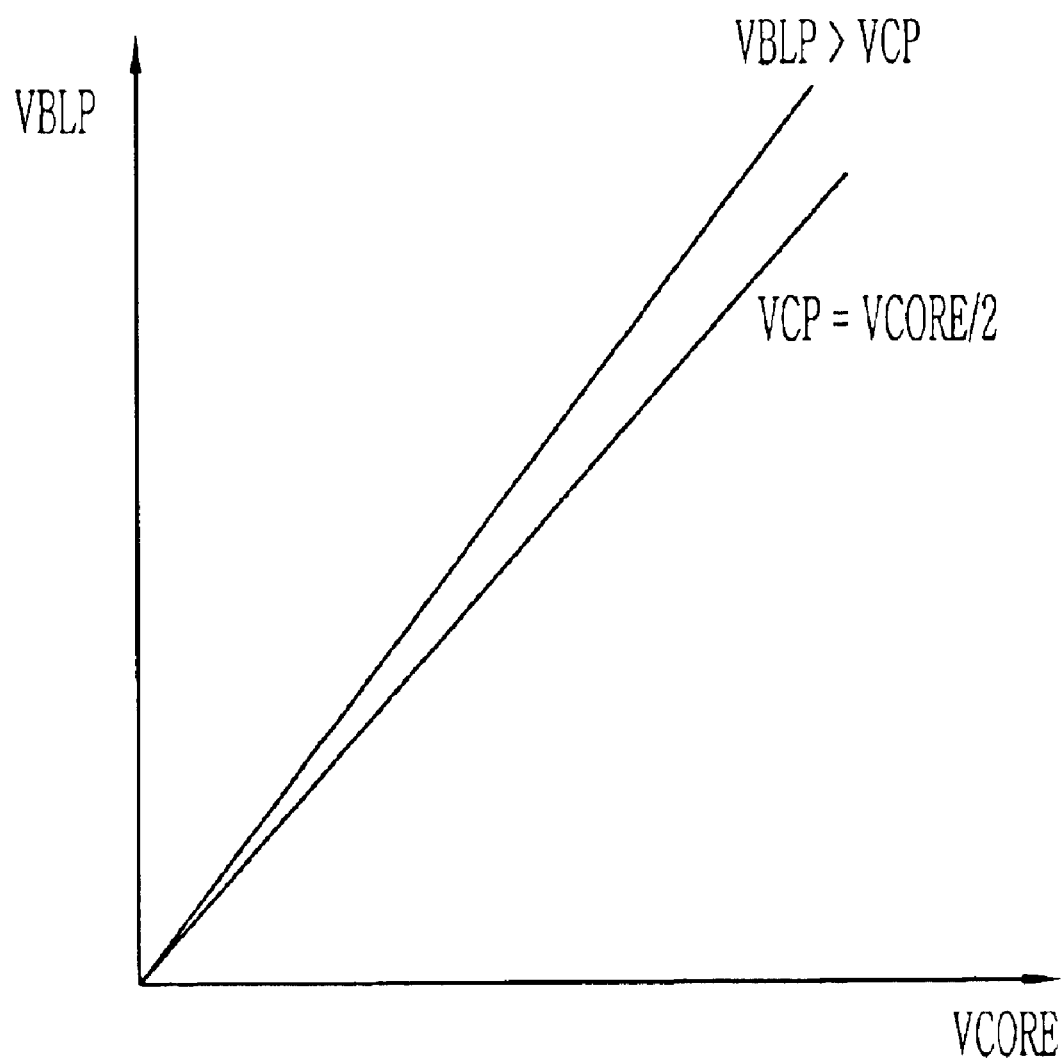
FIG. 6 shows a waveform shown to explain variation in the bit line precharge voltage (VBLP) depending on the introduction of the column reset voltage (VCORE) into the bit line precharge voltage (VBLP) in an active operation of the bank.

In the prior art, as the bit line precharge voltage (VBLP) generated through the bit line precharge voltage generator 20 is commonly supplied to the bit lines BL, BLb and the sense amplifier I/O lines SIO, SIOb through the supply line 22 as shown in FIG. 5, the potential of the bit lines BL, BLb is increased when the column reset voltage (VCORE) is backward introduced through the sense amplifier I/O lines SIO, SIOb. In the preferred embodiment of the present invention, however, the bit line precharge voltage generator 110 and the sense amplifier I/O voltage generator 120 that are independently separated are disposed and the sense amplifier I/O voltage (VSIO) and the bit line precharge voltage (VBLP) that do not affect each other are supplied through the bit line precharge voltage generator 110 and the sense amplifier I/O voltage generator 120, as shown in FIG. 7. Accordingly, even if the column reset voltage (VCORE) flows backward through the sense amplifier I/O lines SIO, SIOb, it has never influence on the bit lines BL, BLb.

Thereafter, in a stand-by PCG operation command, the row matrix signal (Row_mat) becomes a Low level and the row matrix bar signal (Row_matb) becomes a High level. For this reason, the potential of the sense amplifier I/O lines SIO, SIOb that was charged with the column reset voltage (VCORE) are all discharged with the sense amplifier I/O voltage (VSIO). In other words, the local I/O line LIO and the sense amplifier I/O lines SIO, SIO are electrically isolated by the row matrix signal (Row_mat) and the column reset voltage (VCORE) is no longer introduced into the sense amplifier I/O lines SIO, SIOb. Thereby the sense amplifier I/O lines SIO, SIOb are discharged with the sense amplifier I/O voltage (VSIO).

Figure 10:
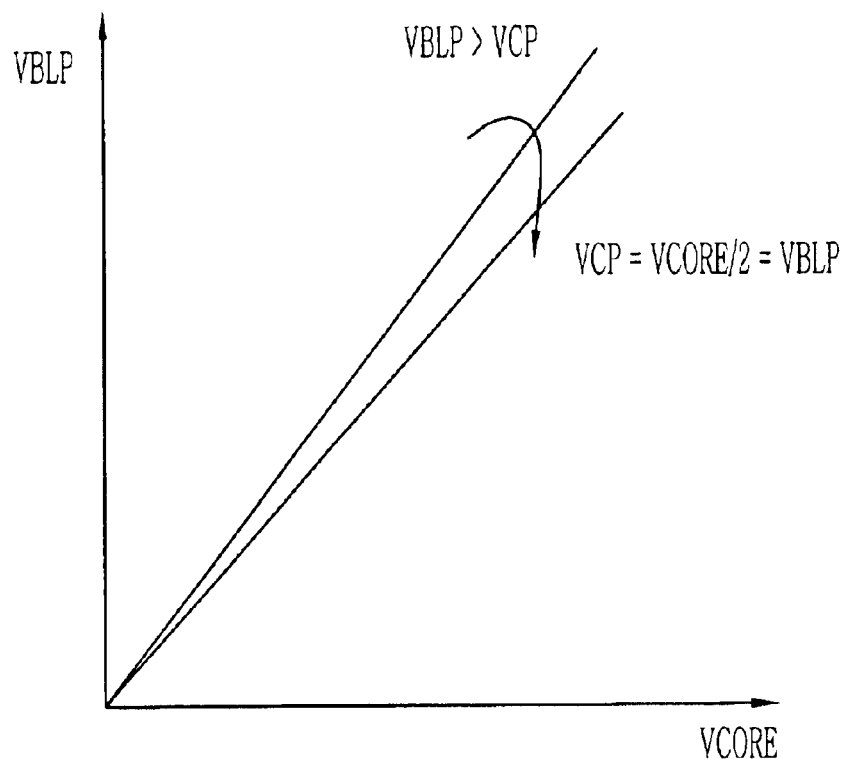
FIG. 10 shows a waveform shown to explain variation in the bit line precharge voltage (VBLP) depending on the introduction of the column reset voltage (VCORE) into a sense amplifier I/O voltage (VSIO) in the active operation of the bank.

As described above, in the semiconductor memory device according to the preferred embodiment of the present invention, the voltage supplied to the bit line equalization circuit 112 and the voltage supplied to the sense amplifier I/O line equalization circuit 122 are not supplied through the same voltage generator (see FIG. 5), but are independently supplied through different voltage generators, i.e., the bit line precharge voltage generator 110 and the sense amplifier I/O voltage generator 120. Accordingly, upon the active operation ACT, the transistors Q15 and Q16 are operated by the row matrix signal (Row_mat), as shown in FIG. 9. In case that the sense amplifier I/O lines SIO, SIOb and the local I/O lines LIO, LIOb are electrically connected, although the column reset voltage (VCORE) flows backward to the output terminal of the sense amplifier I/O voltage generator 120 through the sense amplifier I/O lines SIO, SIOb, it have never influence on the bit line precharge voltage (VBLP). In other words, in the prior art, the bit line precharge voltage (VBLP) is increased higher than the cell plate voltage (VCP) as shown in FIG. 10. In the present invention, however, the bit line precharge voltage (VBLP) is kept same as the cell plate voltage (VCP).

Figure 11:
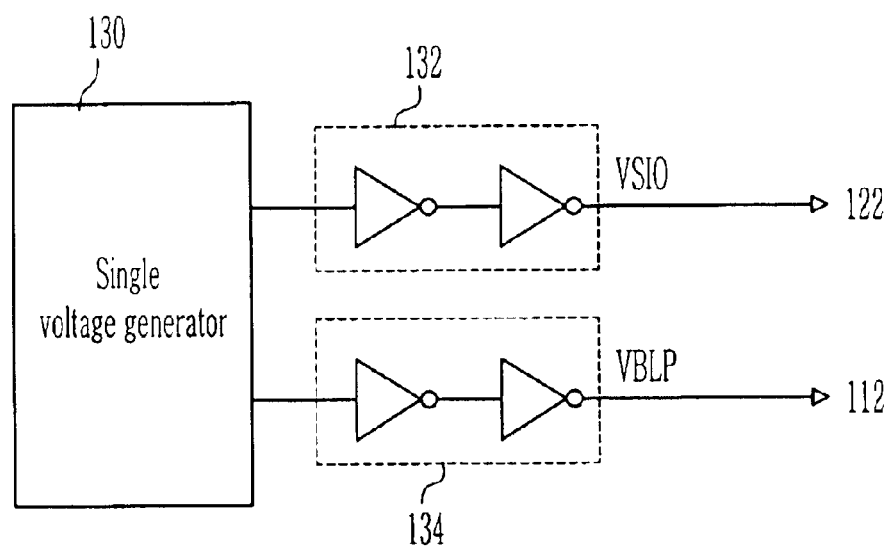
FIG. 11 is a block diagram illustrating a means for generating the bit line precharge voltage (VBLP) and the sense amplifier I/O voltage (VSIO) through a single voltage generator according to another embodiment of the present invention.

Meanwhile, as shown in FIG. 7, in the semiconductor memory device according to the preferred embodiment of the present invention, the bit line precharge voltage generator 110 and the sense amplifier I/O voltage generator 120 are independently separated and generate the voltages (VSIO, VBLP), respectively. For example, however, as shown in FIG. 11, the bit line precharge voltage generator 110 and the sense amplifier I/O voltage generator 120 may generate the voltages (VSIO, VBLP) having the same voltage level through the single voltage generator 130 and independently supply the sense amplifier I/O voltage (VSIO) and the bit line precharge voltage (VBLP) that are generated to have the same voltage level through buffer units 132 and 134, respectively. In other words, it is required that the circuit be constructed so that the voltage (VCORE) flowing backward to the line to which the sense amplifier I/O voltage (VSIO) is supplied does not flow backward to the line to which the bit line precharge voltage (VBLP) is supplied.

According to the present invention, a voltage generator for supplying a sense amplifier I/O voltage (VSIO) and a voltage generator for supplying a bit line precharge voltage (VBLP) are independently separated. It is thus possible to prevent the bit line precharge voltage (VBLP) from increasing when the sense amplifier I/O voltage (VSIO) is increased due to the introduction of a column reset voltage (VCORE).

Moreover, according to the present invention, it is possible to prevent an increase of the bit line precharge voltage (VBLP) depending on the introduction of the column reset voltage (VCORE) and minimize loss of a cell data, thus improving refresh characteristics.

Although the foregoing description has been made with reference to the preferred embodiments, it is to be understood that changes and modifications of the present invention may be made by the ordinary skilled in the art without departing from the spirit and scope of the present invention and appended claims.

What is claimed is:

1. A semiconductor memory device comprising:

a cell array consisting of a number of memory cells;

a bit line sense amplifier connected to the memory cell through a bit line, for sensing data of the memory cell;

a bit line equalization circuit for equalizing the bit line sense amplifier with the same voltage level;

a sense amplifier I/O line electrically connected to the bit line according to a column signal;

a sense amplifier I/O line equalization circuit for equalizing the sense amplifier I/O line with the same voltage level;

a local I/O line electrically connected to the sense amplifier I/O line according to a row matrix signal;

a local I/O line equalization circuit for equalizing the local I/O line with the same voltage level; and an I/O sense amplifier connected to the local I/O line, for sensing and outputting the data sensed through the bit line sense amplifier, wherein the bit line and the sense amplifier I/O line are equally precharged with voltages that are independently supplied through different supply lines by the bit line equalization circuit and the sense amplifier I/O line equalization circuit that are operated by an inverse signal of the row matrix signal.

2. The semiconductor memory device of claim 1, wherein the voltages are generated through different voltage generators, respectively.

3. The semiconductor memory device of claim 1, wherein the voltages are generated through the same voltage generator.

4. A semiconductor memory device including a bit line, a bit line sense amplifier for sensing data of a memory cell through the bit line, a sense amplifier I/O line electrically connected to the bit line according to a column signal, a local I/O line electrically connected to the sense amplifier I/O line according to a row matrix signal, and an I/O sense amplifier for outputting the data sensed through the bit line sense amplifier through the local I/O line, wherein both ends of the bit line and the sense amplifier I/O line are precharged with the same voltage level by means of voltages that are independently supplied through different supply lines.

5. The semiconductor memory device of claim 4, wherein the voltages are generated through different voltage generators, respectively.

6. The semiconductor memory device of claim 4, wherein the voltages are generated through the same voltage generator.

* * * * *